(12) United States Patent
Ehrke et al.

(10) Patent No.: US 7,168,607 B2
(45) Date of Patent: Jan. 30, 2007

(54) METHOD AND DEVICE FOR CLEANING AND THEN BONDING SUBSTRATES

(76) Inventors: Hans-Ulrich Ehrke, Josef-Jägerhuber-Strasse 10, 82319 Starnberg (DE); Markus Gabriel, Jennerweg 13, 85748 Garching (DE); Richard Buttinger, Albr.-Altendorfer Weg 6a, 84034 Landshut (DE)

( * ) Notice: Subject to any disclaimer, the term of this patent is extended or adjusted under 35 U.S.C. 154(b) by 0 days.

(21) Appl. No.: 10/311,568

(22) PCT Filed: Jun. 21, 2001

(86) PCT No.: PCT/EP01/07042

§ 371 (c)(1),
(2), (4) Date: Jul. 17, 2003

(87) PCT Pub. No.: WO01/99154

PCT Pub. Date: Dec. 27, 2001

(65) Prior Publication Data

US 2004/0014298 A1   Jan. 22, 2004

(30) Foreign Application Priority Data

Jun. 21, 2000  (DE)  ................. 100 30 431

(51) Int. Cl.
*B23K 31/23*    (2006.01)
(52) U.S. Cl. .................................................. 228/207
(58) Field of Classification Search ............... 228/201, 228/202
See application file for complete search history.

(56) References Cited

U.S. PATENT DOCUMENTS

| | | | |
|---|---|---|---|
| 4,883,215 A | 11/1989 | Goesele et al. ............ 228/116 |
| 5,129,827 A | 7/1992 | Hoshi et al. .................. 437/62 |
| 5,131,968 A | 7/1992 | Wells et al. ................ 156/153 |
| 5,308,400 A * | 5/1994 | Chen ............................. 134/2 |
| 5,395,788 A * | 3/1995 | Abe et al. ................... 438/690 |
| 5,449,405 A * | 9/1995 | Cardinali et al. ............. 118/50 |
| 5,706,843 A * | 1/1998 | Matsuo ....................... 134/153 |
| 5,804,494 A | 9/1998 | Mitani et al. ............... 438/455 |
| 5,868,865 A * | 2/1999 | Akimoto ....................... 134/33 |
| 6,008,113 A | 12/1999 | Ismail et al. ................ 438/615 |
| 6,018,884 A | 2/2000 | Fukunaga et al. ............ 34/107 |
| 6,051,481 A | 4/2000 | Kuiken et al. .............. 438/455 |
| 6,375,741 B2 * | 4/2002 | Reardon et al. ............ 118/313 |
| 6,491,764 B2 * | 12/2002 | Mertens et al. ............... 134/36 |
| 6,632,289 B2 * | 10/2003 | Masui et al. ................... 134/3 |
| 6,770,151 B1 * | 8/2004 | Ravkin et al. ................ 134/33 |
| 6,863,796 B2 * | 3/2005 | Chueh et al. ............... 205/220 |

FOREIGN PATENT DOCUMENTS

| | | |
|---|---|---|
| EP | 0999577 A2 | 5/2000 |
| JP | 57195593 | * 12/1982 |

OTHER PUBLICATIONS

Patent Abstracts of Japan Publication No. 60072234 A, no date avail : no author avail.
Patent Abstracts of Japan Publication No. 09017768, no date avail : no author avail.
Patent Abstracts of Japan Publication No. 09213666 A, no date avil: no author avail.

* cited by examiner

*Primary Examiner*—Jonathan Johnson
(74) *Attorney, Agent, or Firm*—Perman & Green, LLP

(57) ABSTRACT

The invention relates to a method and to a device for cleaning and then bonding substrates. According to the invention, at least two opposite substrates are obliquely or vertically sprayed with a cleansing liquid by means of at least one nozzle and are preferably dried, aligned and directly bonded under micro-clean room conditions. The bonding process is preferably visually monitored during bonding in order to immediately remove insufficiently bonded substrates from the process. The inventive device is compact and allows integration of the process steps in a single installation without disruption. The invention is further characterized by an improved quality of the bonded layers and an improved productivity of the bonding process. It also allows the use of novel bonding processes.

21 Claims, 5 Drawing Sheets

METHOD AND DEVICE FOR CLEANING AND THEN BONDING SUBSTRATES

Figure 1:
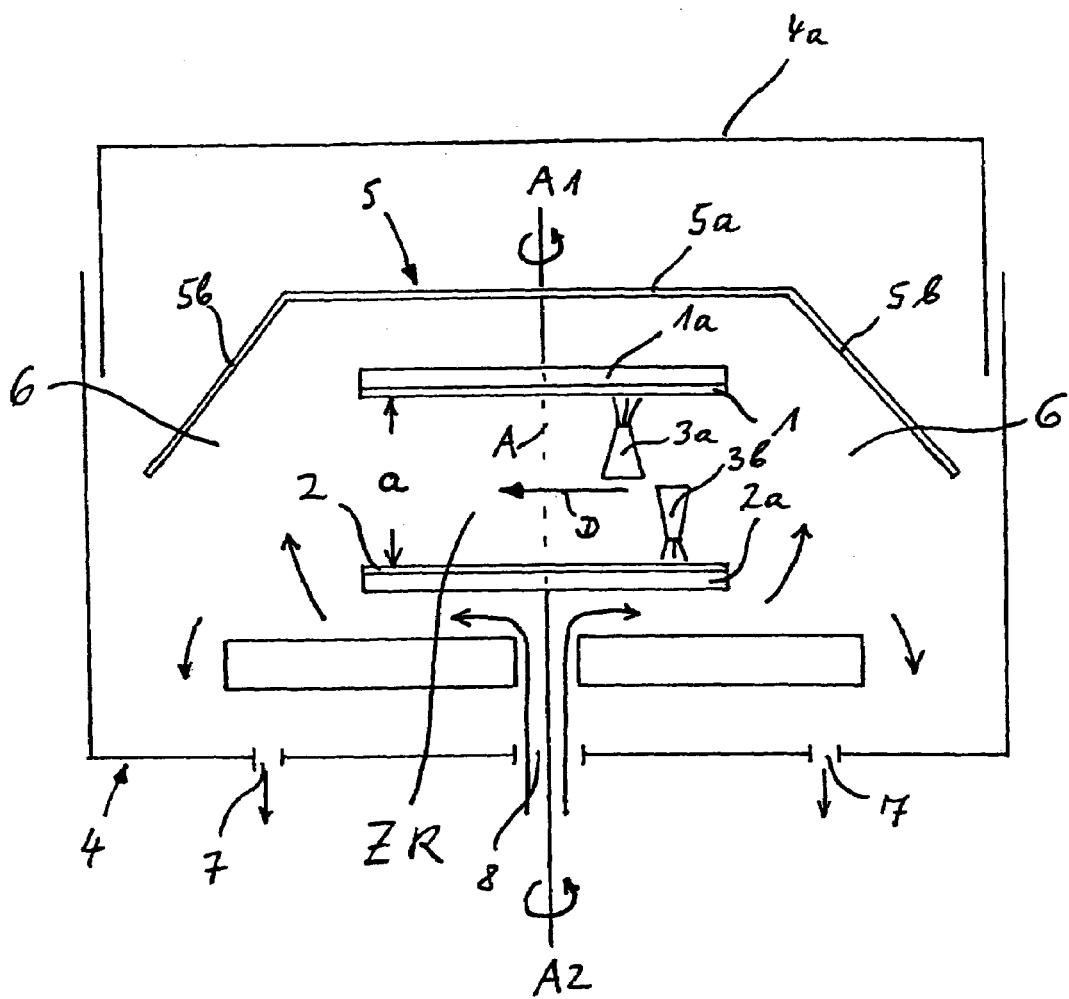

This application claims the benefit of the earlier filed International Application No. PCT/EP01/07042, International Filing Date, Jun. 21, 2001, which designated the United States of America, and which international application was published under PCT Article 21(2) as WO Publication No. WO 01/99154 A1.

The invention relates to a device and a method for cleaning and then bonding substrates (wafers). The invention can preferably be used for direct or fusion bonding, but also for wafer cleaning and subsequently bonding in a separate bonding machine.

For bonding of, e.g., SOI wafers, it is required that particles having a size of more than 0.2 μm are removed from the surfaces to be bonded. It is difficult to achieve such a high degree of cleanliness during waver preparation. Even in case of a very good wafer preparation, new particles can reach the surfaces to be bonded directly before bonding. These particles then cause bubbles between the bonded surfaces.

U.S. Pat. No. 4,883,215 discloses a method for bubble-free bonding of silicon wafers. This method comprises the following steps: Positioning a first wafer and a second wafer in closely spaced-apart and parallel relationship to each other, introducing a cleansing liquid into the gap-between the two surfaces to be bonded, flushing the cleansing liquid, drying the cleaned surfaces and moving the two wafers together in order to bring them into contact and bond them. The wafers are, e.g., held by means of Teflon spacers having a thickness of about 550 μm. Then the space between the wafers is rinsed in a water stream streaming through the space between the two wafers parallel with the wafer surfaces. The wafers are preferably rotated relative to the water stream, or the water stream is rotated relative to the wafers. After having been cleaned by streaming water, the wafers are dried by rotation and spinning off the water. The bonding is then caused by removal of the spacers and pressure contact. According to the document, the method is advantageous in that it can also be carried out outside of clean room facilities.

With respect to the technical background, it is also referred to the following prior art: JP-A-60-72234, JP-A-9-213666 and U.S. Pat. Nos. 5,131,968, 6,051,481, 5,804,494, 6,008,113 and 5,129,827.

In contrast thereto, it is an object of the invention to provide a device and a method for bonding substrates (wafers) in which the surface quality of the wafers to be bonded is further improved vis-à-vis the prior art, the device is compact and the substance throughput can be increased.

This object is achieved with the features of the claims.

In achieving this object, the invention starts out from the following basic idea. In the method according to the invention, at least two substrates are arranged in parallel and opposing one another. A gap is formed between these substrates, wherein this gap is so large that it can at least receive a nozzle for spraying a cleansing liquid, e.g. distilled highly pure water or another suitable liquid, vertically onto the substrate surfaces. The substrates are then rotated around their center axis at a constant or variable speed depending on the cleaning conditions; nozzles are moved, e.g., radially over the substrates, and the cleansing liquid is sprayed or jetted obliquely or vertically onto the substrate surfaces. Then, the remaining liquid is preferably spun off by rotating the substrates around their center axes, wherein the distance between the substrates can be reduced. Then the substrates are brought in contact with each other and directly bonded. During cleaning, drying and bonding, micro-clean room conditions are preferably maintained in the environment of the substrates to be processed. This is achieved by supplying an inert gas and by a corresponding shielding which ensures that the room within the shielding, and in particular the gap between the substrates, is kept free of particles; this shielding also acts as a splash guard for cleansing fluid and takes the inert gas along during rotation, i.e. during drying by spinning off the liquid.

During bonding, the bonding process is preferably visually monitored (on-line), and eventually the quality of the bond between the substrates is determined.

The device of the invention consists of at least two substrate holders for two substrates, each of which being arranged on a rotational axis and movably with respect to each other one, and at least one nozzle which is movable in a space between the substrate holders, and a means for bonding the substrates arranged on the substrate holders. Preferably, an outer housing and a shielding are provided; the shielding is connected with one of the rotational axes and is arranged at a predetermined distance from one of the substrate holders and is movable therewith in order to create, together with a supplied inert gas, a micro-clean room in the environment of the substrate holders. A means for visually monitoring the bonding process during bonding and for determining the quality of the bond between the substrates is preferably provided.

By cleaning the substrates by means of a liquid jet being sprayed obliquely or vertically with respect to the substrate surface, it is possible to obtain highly clean substrate surfaces on which no particles can be found. In the infrared test, the bonded substrates were free of bubbles. The compact configuration of the device which comprises an own micro-clean room reduces the dependency of the method from the quality of the clean room environment. Moreover, the integration of the method steps in a compact installation increases the wafer throughput because no interruption is necessary between the individual steps. Since air can be kept away from the wafers before bonding, it is possible to commercially use also bonding processes which up to now could have been used with substantial effort only in laboratories. By monitoring the bonding process, an insufficient bond between the substrates can be determined already directly after bonding so that further processing can be prevented.

In the following, the invention is described in more detail in connection with the drawings in which FIG. 1 is a principle drawing of an embodiment of the device of the invention, and FIGS. 2 to 5 show the method steps of the invention.

An embodiment of the device of the invention according to FIG. 1 consists of an outer housing 4. In the housing, two substrates 1 and 2 are arranged on a substrate holder 1a and 2a, respectively, at a distance a from one another so as to form a gap ZR. The substrates 1 and 2 can be rotated around rotational axes A1 and A2, respectively, and can be moved in the axial direction with respect to one another. The two axes A1 and A2 are either rotated independently of one another, or the two drives are mechanically coupled or electronically synchronized. FIG. 1 shows the method step of cleaning the substrate surfaces. For this purpose, preferably ultrasonic nozzles, in particular megasonic nozzles 3a and 3b are moved in the gap ZR, preferably radially (arrow D) with respect to the center axis A; moreover, cleansing liquid is sprayed or jetted obliquely or vertically onto the substrate surface. Thus, the distance a between the substrates 1 and 2 must be so large that the nozzles 3a, 3b fit into the gap ZR. A shielding (shielding surface) 5 is arranged on the rotational axis A1, said shielding being movable together with the substrate holder 1a when changing the distance a. Configuring the shielding 5 with a cover plate 5a and side walls 5b extending conically outwards ensures that in the room 6 within the shielding and in the gap ZR a micro-clean room is guaranteed. In this way, the deposition of particles on the surfaces of the substrates 1 and 2 is reliably prevented. The openings 7 serve for evacuating the interior of the housing or for pumping out the inert gas. The housing cover 4a is movable together with the substrate 1 in the vertical direction on the substrate holder 1a and can contain infrared lamps for accelerating the drying process of the substrates after cleaning.

In the following, the method of the invention is described on the basis of FIGS. 2 to 5.

In these Figures, the shielding 5 also serves as the upper substrate holder 1a.

Figure 2:
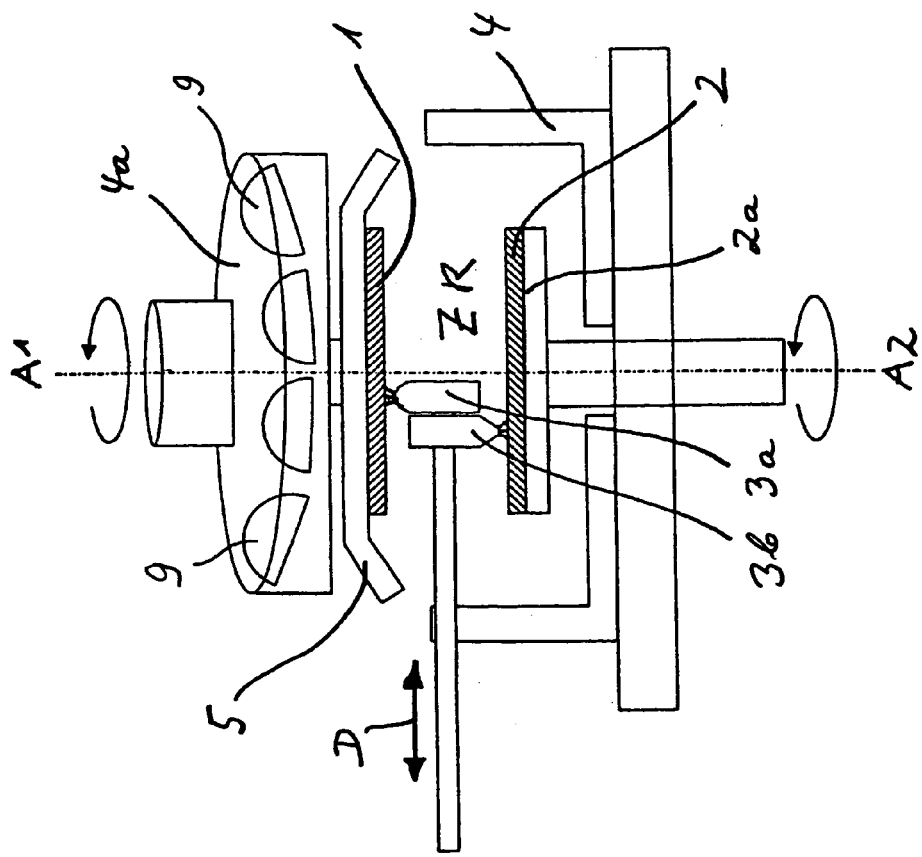

FIG. 2 shows the cleaning of the substrates 1 and 2 by means of two megasonic nozzles 3a and 3b which are moved in the gap ZR radially with respect to the center axis A of the substrates over the substrate surfaces (arrow D) and spay cleansing liquid by meagasonic waves vertically onto the substrate surface. In this step the distance between the substrates 1 and 2 is adjusted to 50 to 250 mm. During the cleaning process, the substrates 1 and 2 rotate around the rotational axes A1 and A2, respectively.

Figure 3:
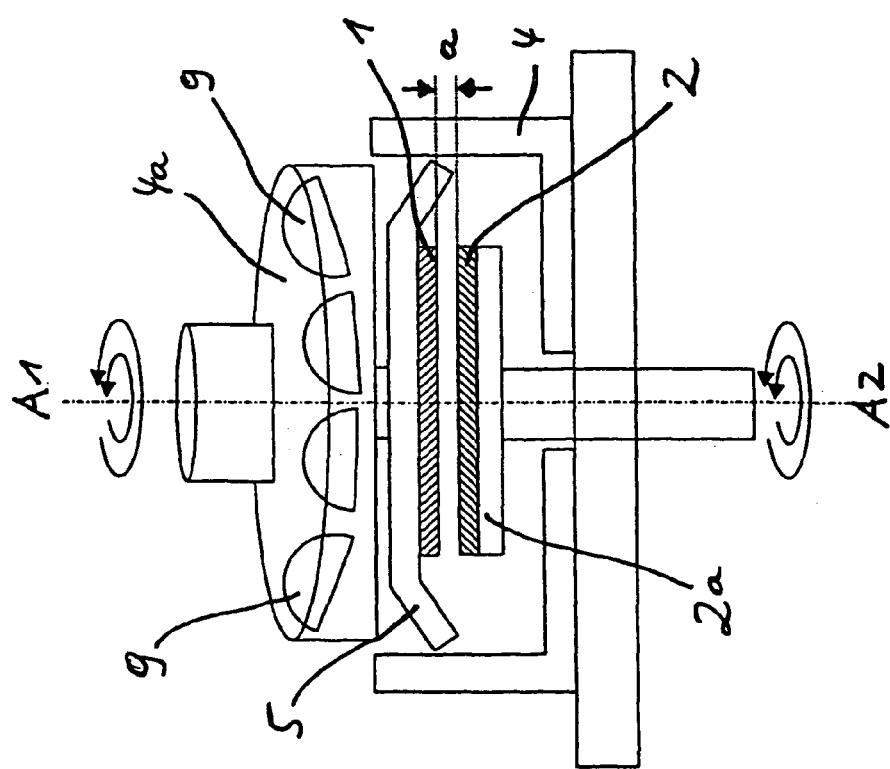

During the drying process, which is shown in FIG. 3, the distance between the substrates is adjusted to 2 to 10 mm. The substrates rotate with accelerated speed so that the liquid is spun off. At the same time, the area around the substrates is filled or washed with an inert gas in order to create a local micro-clean room. Infrared lamps 9, which are arranged, e.g., in the cover 4a of the housing, can be used for accelerating the drying process.

Figure 4:
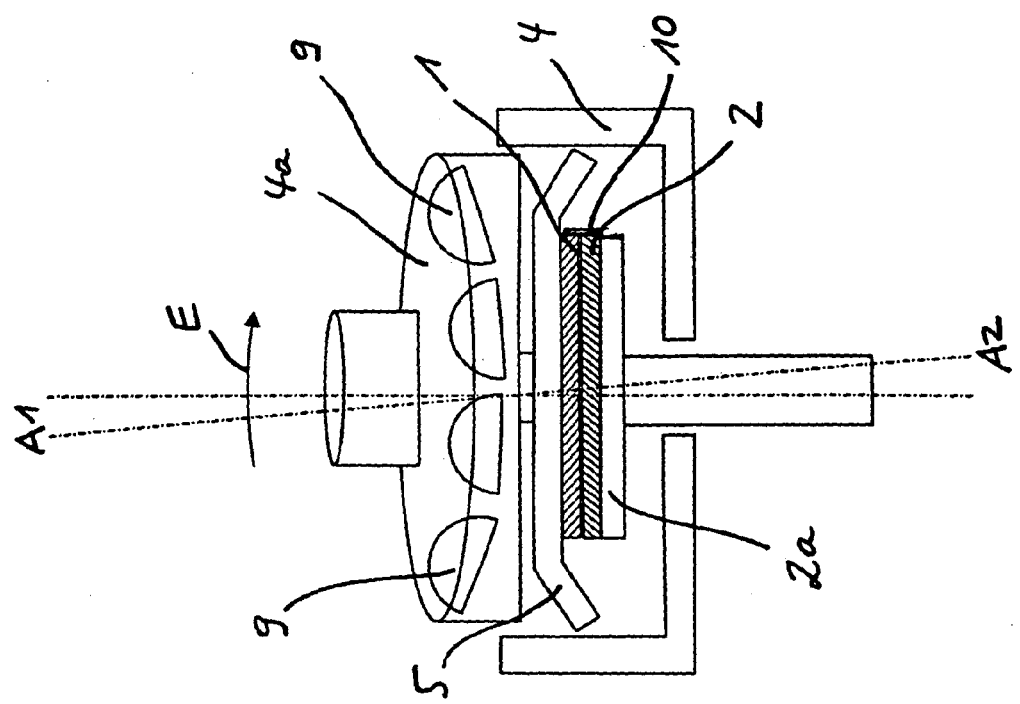

After drying, the substrates 1 and 2 are brought in contact by lowering the substrate 1 onto the substrate 2. Then they are aligned with respect to one another for bonding, as shown in FIG. 4. This is done by tilting and moving the entire housing. As shown in FIG. 4, e.g. the rotational axis A is tilted in the direction of arrow E, and the substrates 1 and 2 are caused to vibrate parallel with respect to their surfaces. It is thus achieved that the substrates swim or move on one another and are stopped together at a stop 10 in order to be thus aligned for bonding.

Figure 5:
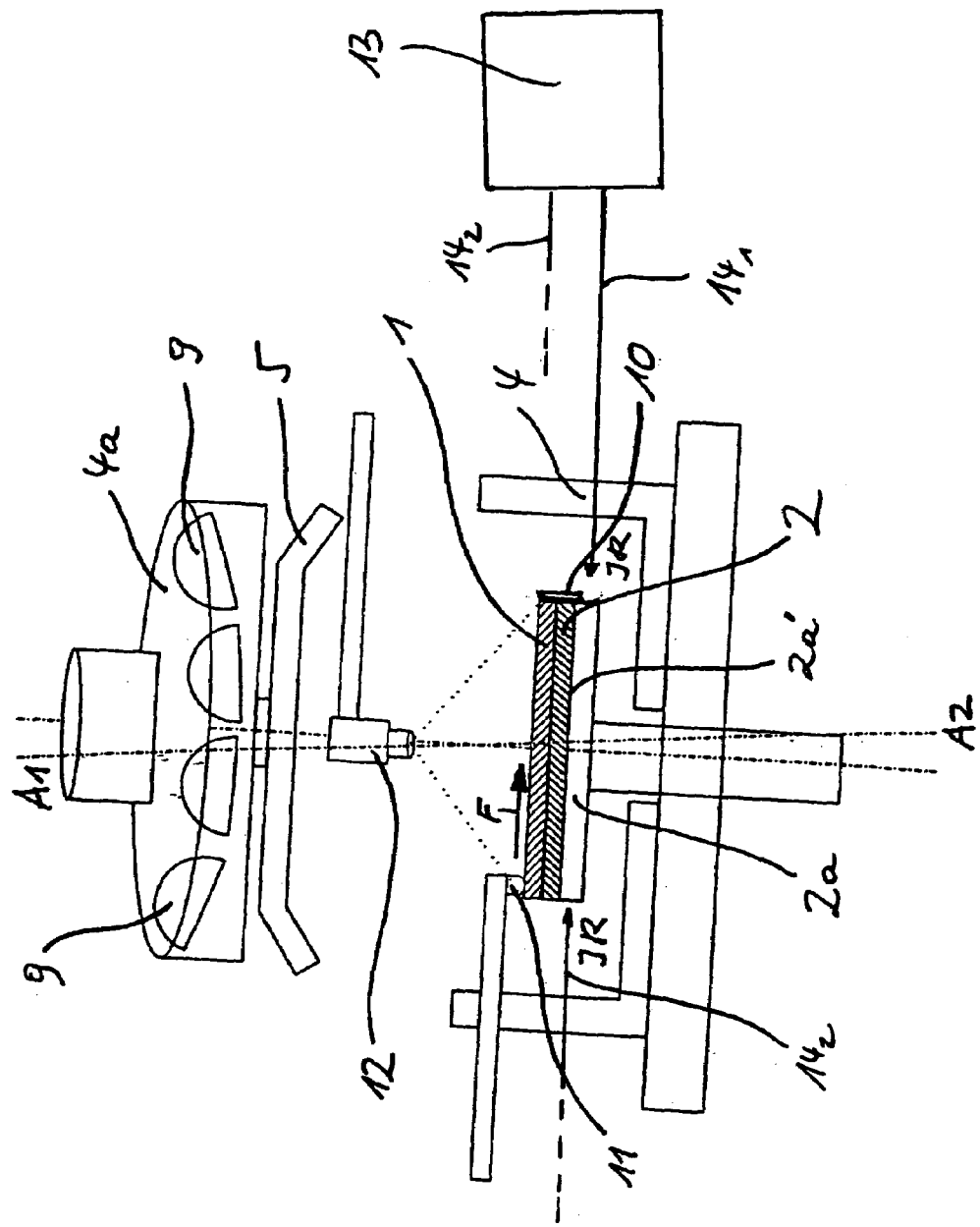

FIG. 5 shows the bonding step in which the axis is tilted and the substrates 1 and 2 are laterally pressed on one another by a pressure pin 11. Thus, a direct bonding starting on the edge (edge bonding) is carried out, wherein the bonding area moves in the direction of arrow F over the two substrates. It is also possible, however, that bonding is started in the center of the substrate (center bonding).

An infrared (IR) camera 12 can be inserted between the substrate 1 and the shielding surface 5, with is moved upwards after placing the substrate 1 onto the substrate 2. The IR camera 12 detects IR (infrared) light which is generated by an IR light source 13 and inputted laterally into the substrate holder 2a preferably by one or a plurality of light guides $14_1$, $14_2$. The IR light is diffusely scattered by the correspondingly selected material of the substrate holder 2a or at least one layer thereof, emerges from the surface 2a' of the substrate holder 2a into the substrate 2, passes through the bonded surfaces of the substrates 2 and 1 and then through substrate 1 and is subsequently detected by the IR camera 12 after emerging from the free surface of the substrate 1. The quality of the substrate bond is made visible by the contrast of the IR light in the IR camera 12. For instance by inclusions between the bonded surfaces, the contrast is changed so that the contrast of the IR light is a measure of the quality of the substrate bond.

The method of the invention and the device of the invention allow substrates (wafers) having a size of 100 to 200 mm and more to be processed. A typical process cycle period is 5 minutes; however, this depends on the specific process. Already at a frequency of 1 MHz, the megasonic nozzles allow the removal of particles up to a diameter of 0.1 µm, at a frequency of 3 MHz particles up to a diameter of 0.03 µm are removed.

The invention claimed is:

1. A method for cleaning and then bonding two or more substrates comprising the steps of:
   (a) arranging at least two substrates so that they are parallel and opposite to each other and form a gap between each other, wherein the gap is so large that it can receive at least one nozzle for spraying a cleansing liquid onto the substrates,
   (b) rotating the substrates around their center axis and moving the nozzle over the substrates, said nozzle spraying a cleansing liquid obliquely or vertically onto the surface of the substrates during said rotation,
   (c) drying the substrates, and
   (d) directly bonding the substrates.

2. The method according to claim 1, wherein the cleansing liquid is sprayed by means of one nozzle for each substrate surface to be cleaned.

3. The method according to claim 1, wherein in method step (c) the remaining cleansing liquid is spun off by rotating the substrates around the center axis in order to dry the substrates.

4. The method according to claim 1, wherein the nozzle or the nozzles is/are moved radially with respect to the center axis of the substrates over the substrate surfaces.

5. The method according to claim 1, wherein the method is carried out in a micro-clean room.

6. The method according to claim 1, wherein the substrates are confined in a housing during method steps (a) to (c) and optionally (d).

7. The method according to claim 5, wherein the micro-clean room is limited by a shielding surface which is connected with the rotational axis of a substrate support of one of the substrates and which can be moved together with or as the substrate support in the direction of the change of the distance of the substrates.

8. The method according to claim 1, wherein during step (c) or directly after this step (c) the substrates are dried by an infrared heater.

9. The method according to claim 1, wherein in steps (a) and (b) the distance between the substrates is adjusted to 50 to 250 mm.

10. The method according to claim 1, wherein in step (c) the distance is adjusted to 2 to 10 mm.

11. The method according to claim 1, wherein at least two ultrasonic nozzles are used.

12. The method according to claim 11, wherein at least two megasonic nozzles are used.

13. The method according to claim 12, wherein the megasonic nozzles are operated at a frequency of $\geq 1$ MHz.

14. The method according to claim 1, wherein an inert gas is added which fills the room within the shielding surface, at least, however, the gap between the substrates.

15. The method according to claim 1, wherein the distance between the substrates is reduced after drying.

16. The method according to claim 15, wherein the reduced distance is 0.05 to 0.5 mm, preferably 0.1 mm.

17. The method according to claim 1, wherein between steps (c) and (d) the substrates are aligned with respect to each other by tilting the center axis and vibrating the substrates so that the substrates slide on one another until they reach a common stop.

18. The method according to claim 1, wherein bonding is caused by means of a pressure pin by an essentially punctiform contact of the substrates at the edge, in the middle or at any other point or by a progressive planar contact.

19. The method according to claim 1, wherein the bonding process is monitored in method step (d) and the quality of the bond between the substrates is determined at the end of the bonding process.

20. The method according to claim 19, wherein the bonding process is monitored by means of IR light passing through the substrates.

21. The method according to claim 20, wherein the IR light emerging from the substrate is detected by an IR camera, and the quality of the substrate bond is determined by the ascertained contrast of the IR light.

* * * * *